United States Patent
Ikeda (10) Patent No.: US 11,545,893 B2
(45) Date of Patent: Jan. 3, 2023

(54) ELECTRONIC CIRCUIT AND ELECTRONIC APPARATUS TO OUTPUT RINGING VOLTAGE

(71) Applicant: KABUSHIKI KAISHA TOSHIBA, Tokyo (JP)

(72) Inventor: Kentaro Ikeda, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 7 days.

(21) Appl. No.: 17/017,127

(22) Filed: Sep. 10, 2020

(65) Prior Publication Data

US 2021/0126552 A1   Apr. 29, 2021

(30) Foreign Application Priority Data

Oct. 23, 2019 (JP) .............................. JP2019-192812

(51) Int. Cl.
| | |
|---|---|
| *H02M 1/44* | (2007.01) |
| *H02M 1/08* | (2006.01) |
| *H02M 7/5387* | (2007.01) |
| *H02M 3/158* | (2006.01) |
| *H02M 3/157* | (2006.01) |

(52) U.S. Cl.
CPC .............. *H02M 1/44* (2013.01); *H02M 1/08* (2013.01); *H02M 3/158* (2013.01); *H02M 7/5387* (2013.01); *H02M 3/157* (2013.01)

(58) Field of Classification Search
CPC .......... G01R 19/16538; G01R 19/0015; G01R 19/0053; G01R 19/04; H02M 3/156; H02M 3/157; H02M 3/335–33592; H02M 3/337; H03K 5/1532
See application file for complete search history.

(56) References Cited

U.S. PATENT DOCUMENTS

| | | | | |
|---|---|---|---|---|
| 4,316,075 A | * | 2/1982 | Isoya ...................... | B23K 9/30 219/124.22 |
| 4,581,900 A | | 4/1986 | Lowe et al. | |
| 5,185,569 A | * | 2/1993 | Katakura ............... | G01R 19/04 381/10 |
| 6,335,948 B1 | * | 1/2002 | Kikuchi ................ | H03K 5/082 327/60 |
| 9,967,485 B2 | | 5/2018 | Yamamura et al. | |
| 2005/0025259 A1 | * | 2/2005 | Miyasita ................ | H03K 5/003 375/319 |

(Continued)

FOREIGN PATENT DOCUMENTS

| | | |
|---|---|---|
| JP | H5-344369 A | 12/1993 |
| JP | H7-26639 B2 | 3/1995 |

(Continued)

*Primary Examiner* — Thienvu V Tran
*Assistant Examiner* — Shahzeb K Ahmad
(74) *Attorney, Agent, or Firm* — Finnegan, Henderson, Farabow, Garrett & Dunner, LLP (57) ABSTRACT

An electronic circuit includes a first peak-hold circuit to output a peak surge voltage free of a ringing component included in a voltage at a voltage input node, a second peak-hold circuit to output a peak surge voltage on which the ringing component included in the voltage at the voltage input node is superimposed, and a subtractor to subtract an output voltage of the first peak-hold circuit from an output voltage of the second peak-hold circuit to output a voltage of the ringing component.

19 Claims, 7 Drawing Sheets

(56) References Cited

U.S. PATENT DOCUMENTS

| | | | |
|---|---|---|---|
| 2018/0159518 A1* | 6/2018 | Poletto | H03K 17/165 |
| 2018/0219547 A1* | 8/2018 | Bon | H03K 5/1532 |
| 2018/0269722 A1* | 9/2018 | Xu | H02J 50/12 |

FOREIGN PATENT DOCUMENTS

| | | | |
|---|---|---|---|
| JP | 10134972 A * | 5/1998 | |
| JP | 3398142 B2 | 4/2003 | |
| JP | 2017-223525 A | 12/2017 | |

\* cited by examiner

ELECTRONIC CIRCUIT AND ELECTRONIC APPARATUS TO OUTPUT RINGING VOLTAGE

CROSS REFERENCE TO RELATED APPLICATIONS

This application is based upon and claims the benefit of priority from the prior Japanese Patent Application No. 2019-192812, filed on Oct. 23, 2019, the entire contents of which are incorporated herein by reference.

FIELD

Embodiments of the present disclosure relate to an electronic circuit and an electronic apparatus.

BACKGROUND

An in-vehicle motor demands a large drive voltage generated by a power transducer. However, wide load fluctuations in the motor or any abnormal circumstances cause a large surge voltage in the drive voltage generated by the power transducer, which could bring about equipment damage or electro-magnetic interference (EMI) noise.

Although there is proposed a circuit for detecting a surge voltage, a ringing voltage is often superimposed on a surge voltage, and it is difficult to detect the surge voltage and the ringing voltage separately. If the surge voltage and the ringing voltage can be detected separately, it would be possible to control the power transducer by generating a control signal for reducing the ringing voltage.

DETAILED DESCRIPTION

According to one embodiment, an electronic circuit includes a first peak-hold circuit to output a peak surge voltage free of a ringing component included in a voltage at a voltage input node, a second peak-hold circuit to output a peak surge voltage on which the ringing component included in the voltage at the voltage input node is superimposed, and a subtractor to subtract an output voltage of the first peak-hold circuit from an output voltage of the second peak-hold circuit to output a voltage of the ringing component.

Hereinafter, embodiments of a ringing detection circuit and a power transducer will be described with reference to the drawings. Hereinafter mainly described are main components of the ringing detection circuit and the power transducer, but the ringing detection circuit and the power transducer may have components and functions which are not illustrated or described. The following description does not intend to exclude components or functions not illustrated or described.

First Embodiment

Figure 1:
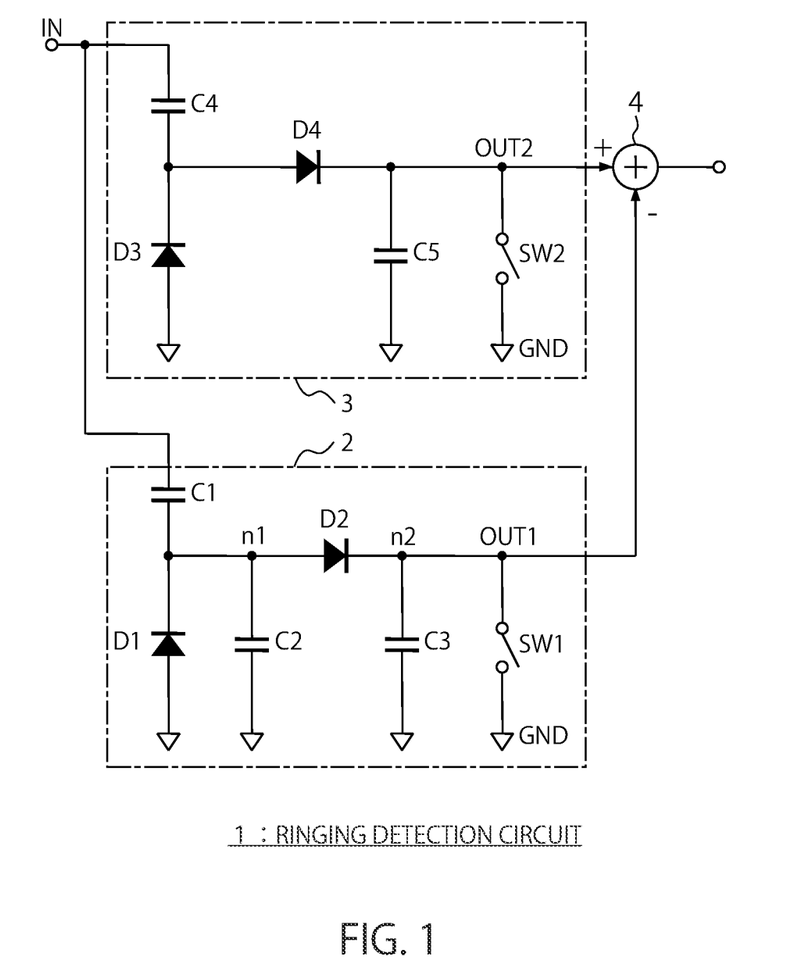
FIG. 1 is a circuit diagram of a ringing detection circuit according to a first embodiment.

FIG. 1 is a circuit diagram of a ringing detection circuit 1 according to a first embodiment. The ringing detection circuit 1 can be also called as an electronic circuit. As will be described, the ringing detection circuit 1 in FIG. 1 is included, for example, in a power transducer and is configured to detect a ringing voltage attributed to a surge voltage generated in the power transducer. The ringing detection circuit 1 in FIG. 1 includes a first peak-hold circuit 2, a second peak-hold circuit 3, and a subtractor 4.

The first peak-hold circuit 2 outputs a peak surge voltage free of a ringing component included in a voltage at a voltage input node IN. A voltage that possibly includes a surge voltage such as an output voltage of a power transducer (not illustrated in FIG. 1) is input to the voltage input node IN. A device or circuit of any type may be connected to the voltage input node IN. With the generation of a surge voltage, ringing is usually superimposed on the surge voltage. Therefore, the surge voltage to be applied to the voltage input node IN varies depending on ringing. The first peak-hold circuit 2 holds the surge voltage free of the ringing component in the voltage at the voltage input node IN.

The second peak-hold circuit 3 outputs a peak surge voltage on which the ringing component included in the voltage at the voltage input node IN is superimposed. In this manner, the first peak-hold circuit 2 holds a peak surge voltage free of the ringing component, while the second peak-hold circuit 3 holds a peak surge voltage with the ringing component superimposed thereon.

The subtractor 4 subtracts an output voltage of the first peak-hold circuit 2 from an output voltage of the second peak-hold circuit 3 so as to output a voltage of the ringing component. The voltage of the ringing component output from the subtractor 4 is used, for example, for feedback control of a control voltage of the power transducer. Alternatively, the output voltage of the subtractor 4 may be used to evaluate the magnitude of the ringing component or for other purposes.

The first peak-hold circuit 2 includes a first capacitor C1, a second capacitor C2, a first rectifier element D1, a second rectifier element D2, and a third capacitor C3.

The first capacitor C1 and the second capacitor C2 are connected between the voltage input node IN and a reference voltage node GND. A voltage that possibly includes a surge voltage such as an output voltage of a power transducer (not illustrated in FIG. 1) is input to the voltage input node IN. The first peak-hold circuit 2 according to this embodiment is configured to accurately detect the surge voltage included in the voltage input to the voltage input node IN. To the voltage input node IN, a device or circuit of any type may be connected. The reference voltage node GND is, for example, a ground node but is not limited in voltage level.

The first rectifier element D1 may be a diode having an anode connected to the reference voltage node GND and a cathode connected to a connection node n1 of the first capacitor C1 and the second capacitor C2.

The second rectifier element D2 may be a diode having an anode connected to the connection node n1 of the first capacitor C1 and the second capacitor C2. A peak surge voltage input to the voltage input node IN is output from a cathode of the second rectifier element D2.

In the first peak-hold circuit 2 in FIG. 1, the third capacitor C3 is connected between the cathode of the second rectifier element D2 and the reference voltage node GND, and a first voltage output node OUT1 is connected to a connection node n2 between the cathode of the second rectifier element D2 and the third capacitor C3. Accordingly, the first voltage output node OUT1 outputs the peak surge voltage input to the voltage input node IN. The first voltage output node OUT1 may not be connected to the cathode of the second rectifier element D2. As a modification, an anode of another rectifier element may be connected to the cathode of the second rectifier element D2. The first voltage output node OUT1 is connected to a first input node of the subtractor 4.

The second peak-hold circuit 3 includes a fourth capacitor C4, a third rectifier element D3, a fourth rectifier element D4, and a fifth capacitor C5. From a cathode of the fourth rectifier element D4, output is a peak surge voltage on which the ringing component included in the voltage at the voltage input node IN is superimposed.

The fourth capacitor C4 has one end connected to the voltage input node IN, another end connected to a cathode of the third rectifier element D3, and the other end connected to an anode of the fourth rectifier element D4. An anode of the third rectifier element D3 is connected to the reference voltage node GND. A cathode of the fourth rectifier element D4 is connected to one end of the fifth capacitor C5 and to a second input node of the subtractor 4. The other end of the fifth capacitor C5 is connected to the reference voltage node GND. The third rectifier element D3 and the fourth rectifier element D4 both may be a diode.

The first peak-hold circuit 2 may include a first switch SW1 connected in parallel with the third capacitor C3. Similarly, the second peak-hold circuit 3 may include a second switch SW2 connected in parallel with the fifth capacitor C5. When the subtractor 4 outputs the voltage of the ringing component, the first switch SW1 and the second switch SW2 are temporarily turned on to discharge the third capacitor C3 and the fifth capacitor C5. The first switch SW1 and the second switch SW2 are normally turned off and regularly or irregularly turned on to discharge the third capacitor C3 and the fifth capacitor C5. Accordingly, it is possible to continuously detect the voltage of the ringing component in the voltage at the voltage input node IN.

Figure 2A:
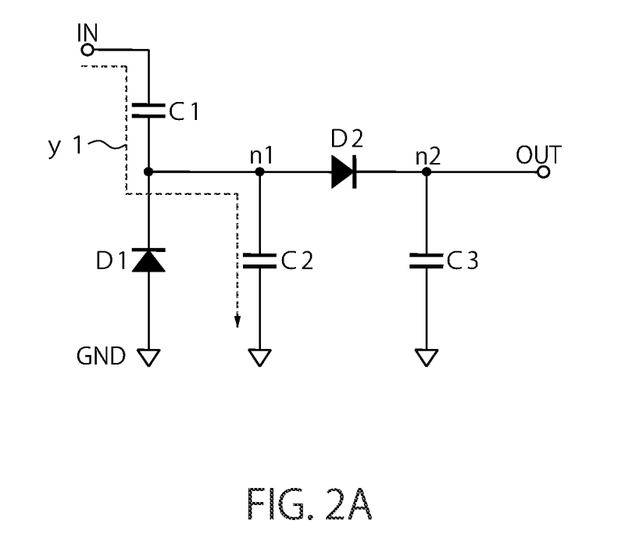
FIG. 2A is a view for describing circuit operation of a first peak-hold circuit in FIG. 1.
Figure 2B:
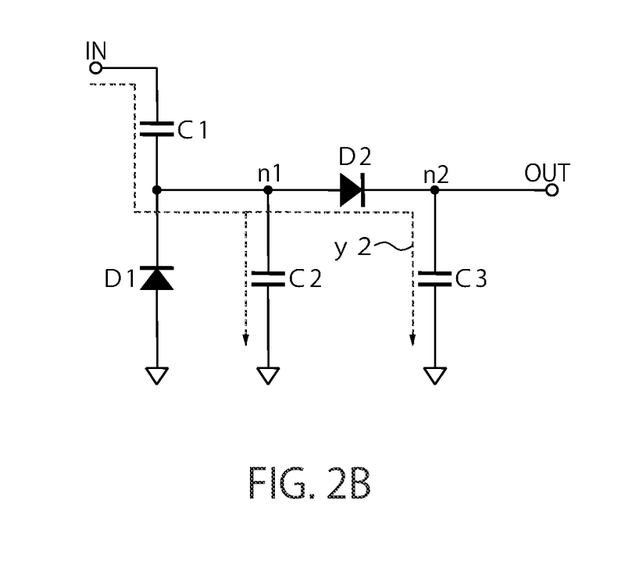
FIG. 2B is a view for describing the circuit operation subsequent to FIG. 2A.
Figure 2C:
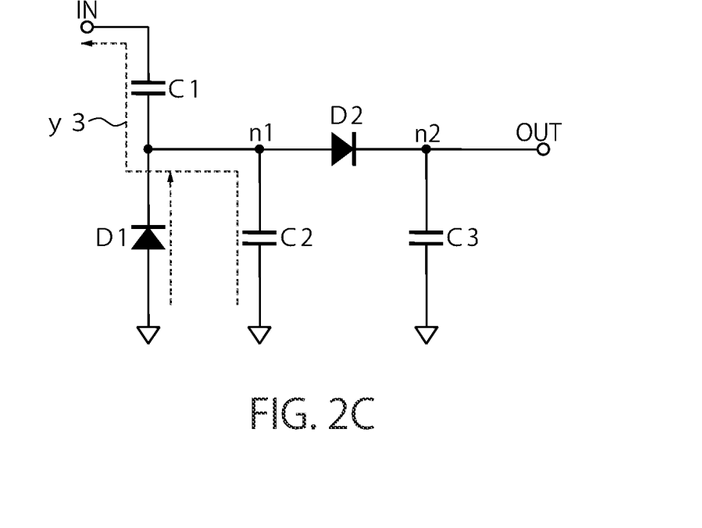
FIG. 2C is a view for describing the circuit operation subsequent to FIG. 2B.

FIGS. 2A, 2B, and 2C are views for describing circuit operation of the first peak-hold circuit 2 in FIG. 1. With a rise in voltage input to the voltage input node IN, a current flows from the voltage input node IN to the second capacitor C2 via the first capacitor C1 as illustrated with arrowed line y1 in FIG. 2A. Accordingly, the voltage at the voltage input node IN is divided by the first capacitor C1 and the second capacitor C2.

With an increase in quantity of electric charge accumulated in the second capacitor C2, a voltage VC2 at the connection node n1 of the first capacitor C1 and the second capacitor C2 gradually increases. As shown in Formula (1), when the voltage VC2 at the connection node n1 is higher than a voltage obtained by adding a forward voltage VfD2 at the second rectifier element D2 to a voltage VC3 at the connection node n2 between the cathode of the second rectifier element D2 and the third capacitor C3, a current starts to flow from the second capacitor C2 to the third capacitor C3 via the second rectifier element D2 as illustrated with arrowed line y2 in FIG. 2B.

$$VC2 > VC3 + VfD2 \quad (1)$$

After that, with a decrease in voltage at the voltage input node IN, a current flows from the second capacitor C2 to the voltage input node IN via the first capacitor C1 as illustrated with arrowed line y3 in FIG. 2C, and accumulated electric charge in the first capacitor C1 is discharged. At this time, the second rectifier element D2 blocks a current flow from the third capacitor C3 to the first capacitor C1, which makes it possible for the third capacitor C3 to hold accumulated electric charge. Accordingly, a peak surge voltage at the voltage input node IN is held by the third capacitor C3, and a peak surge voltage is continuously output from the first voltage output node OUT1 connected to the third capacitor C3.

A voltage Vdetect at the first voltage output node OUT1 of the first peak-hold circuit 2 in FIG. 1 is expressed by the following Formula (2).

$$V_{detect} \approx \frac{C_1}{C_1 + C_2 + C_3} V_p - Vf_{D1} - Vf_{D2} \quad (2)$$

When a capacitance of the third capacitor C3 is much smaller than that of the second capacitor C2, Formula (2) is approximated to Formula (3).

$$V_{detect} \approx \frac{C_1}{C_1 + C_2} V_p - Vf_{D1} - Vf_{D2} \quad (3)$$

As shown in Formula (3), the voltage at the first voltage output node OUT1 is determined by a capacitive voltage divider ratio of the first capacitor C1 and the second capacitor C2 when the forward voltages VfD1 and VfD2 at the first rectifier element D1 and the second rectifier element D2 are ignored. Since there is possibility that a high voltage about hundreds to thousands of volts is applied to the voltage input node IN of the first peak-hold circuit 2 of this embodiment, it is desirable that a capacitance of the first capacitor C1 be larger than a capacitance of the second capacitor C2. Accordingly, even when a high voltage is input to the voltage input node IN, the first voltage output node OUT1 outputs a reduced voltage obtained by the capacitive voltage divider ratio of the first capacitor C1 and the second capacitor C2.

Figure 3:
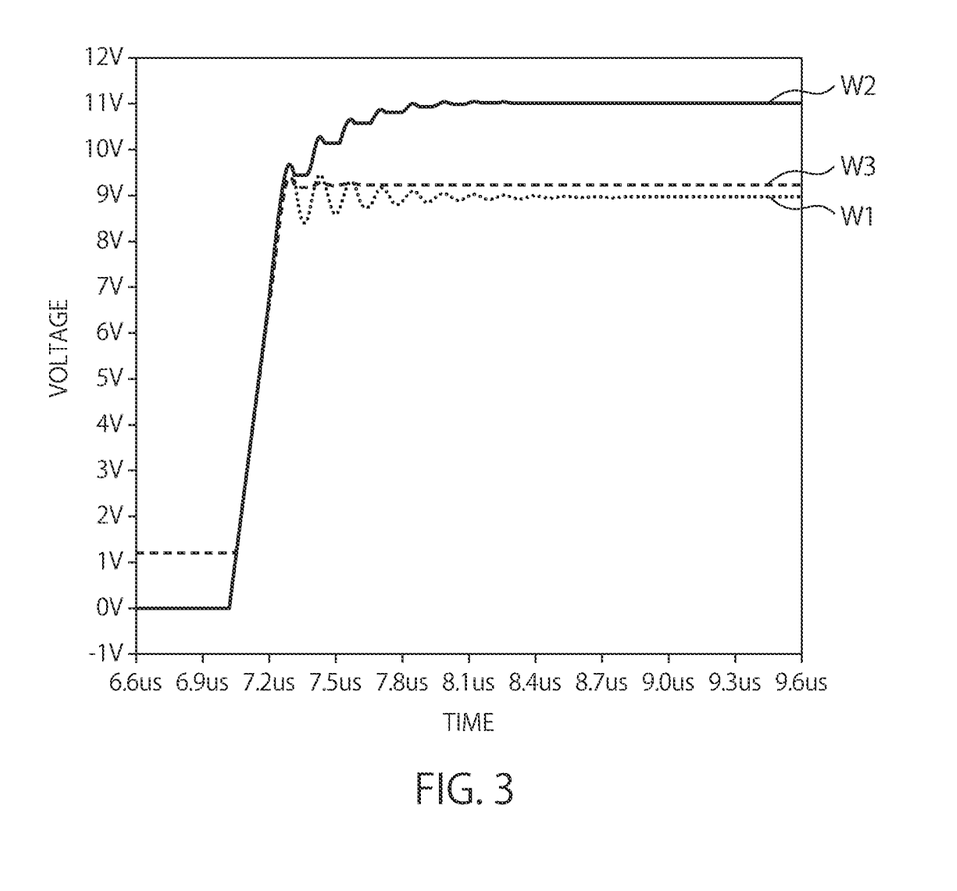
FIG. 3 illustrates a voltage waveform of the first peak-hold circuit.

FIG. 3 illustrates voltage waveform W1 at the first voltage output node OUT1 of the first peak-hold circuit 2, voltage waveform W2 at the second voltage output node OUT2 of the second peak-hold circuit 3, and voltage waveform W3 at the voltage input node IN. In FIG. 3, the time [μs] is taken along the abscissa, and the voltage [V] is taken along the ordinate. The voltage waveform W3 at the voltage input node IN is scaled to be coordinated with voltage levels of the voltage waveforms W1 and W2.

In order to avoid influences of ringing, the capacitance of the second capacitor C2 is to be made larger than that of the third capacitor C3. If the capacitance of the third capacitor C3 is larger than that of the second capacitor C2, when the second capacitor C2 is full of accumulated electric charge, a current passing from the voltage input node IN to the first capacitor C1 flows to the third capacitor C3 via the second rectifier element D2, leading to an increase in voltage at the first voltage output node OUT1. At this time, if ringing is generated in the voltage at the voltage input node IN, the voltage at the first voltage output node OUT1 rises according to the ringing. Therefore, it is desirable that the capacitance of the second capacitor C2 be larger than that of the third capacitor C3 to cause the third capacitor C3 not to accumulate electric charge when the voltage at the voltage input node IN changes due to ringing.

In order to avoid influences of ringing, the following Formula (4) is to be satisfied.

$$\frac{C_1 V_{in0}}{C_1 + C_2 + C_3} + Vf_D \geq \frac{C_1 V_{in1}}{C_1 + C_2} \quad (4)$$

Provided that the voltage input to the voltage input node IN changes periodically, and a voltage at the voltage input node IN in the first cycle is Vin0. In that case, a voltage at the connection node n1 between the second capacitor C2 and the second rectifier element D2 when a current flows from the second capacitor C2 to the third capacitor C3 via the second rectifier element D2 is equal to a value obtained by adding the forward voltage VfD2 at the second rectifier element D2 to a voltage between both ends of the second capacitor C2. This voltage at the connection node n1 is represented by the left-hand side of Formula (4).

Assuming that a voltage Vin1 of the voltage input node IN in the second cycle following the first cycle includes ringing, a voltage at the connection node n1 in the second cycle is equal to a value represented by the right-hand side of Formula (4). Therefore, in order to prevent a current depending on a ringing component from flowing to the third capacitor C3, the voltage between both ends of the second capacitor C2 in the second cycle is to be less than a voltage between both ends of the third capacitor C3 in the first cycle. Accordingly, Formula (4) is obtained.

Deformation of Formula (4) leads to Formula (5) or Formula (6).

$$C_2 \geq \frac{\sqrt{4C_1 \cdot C_3 Vf \cdot V_{in} + C_3^2 Vf^2} + (-C_3 - 2C_1)Vf}{2Vf} \quad (5)$$

$$C_3 \leq \frac{(C_2^2 + 2C_1 C_2 + C_1^2)Vf}{C_1 V_{in} + (-C_2 - C_1)Vf} \quad (6)$$

When the capacitances of the first capacitor C1 and the second capacitor C2 are set first, the capacitance of the third capacitor C3 may be set to satisfy the inequality of Formula (6). Furthermore, when the capacitances of the first capacitor C1 and the third capacitor C3 are set first, the capacitance of the second capacitor C2 may be set to satisfy the inequality of Formula (5). Formulae (5) and (6) are deformation of Formula (4). Setting the capacitances of the first capacitor C1 to the third capacitor C3 to satisfy Formula (4) enables the first peak-hold circuit 2 to hold the surge voltage free of the ringing component.

Note that, actually, the voltage waveforms W1 and W2 in FIG. 3 and the voltage waveform W3 are significantly different in voltage level and that the voltage waveform W1 at the voltage input node INn1 has a voltage level larger than that of the voltage waveform W2 at the voltage output node n2. FIG. 3 illustrates the voltage level of the voltage waveform W1 being scaled to make it easy to compare influences of the ringing.

Next, the operation of the second peak-hold circuit 3 will be described. The second peak-hold circuit 3 has a circuit configuration in which the second capacitor C2 is omitted from the first peak-hold circuit 2. The second peak-hold circuit 3 does not include the second capacitor C2. Accordingly, when the voltage at the voltage input node IN changes due to ringing, electric charge depending on the ringing is accumulated in the fifth capacitor C5 through the fourth rectifier element D4. Furthermore, even when the voltage at the voltage input node IN is lower than a surge voltage, the accumulated electric charge of the fifth capacitor C5 is not discharged because of the fourth rectifier element D4. Therefore, a voltage at the second voltage output node OUT2 of the second peak-hold circuit 3 is equal to a voltage to which the ringing component is added, and the voltage gradually increases.

The voltage waveform W2 in FIG. 3 is the voltage waveform at the second voltage output node OUT2 of the second peak-hold circuit 3. As illustrated in FIG. 3, the first peak-hold circuit 2 holds the surge voltage as it is, while the second peak-hold circuit 3 holds the voltage of the ringing component superimposed on the surge voltage gradually accumulated. The subtractor 4 outputs a differential voltage between the voltage waveform W2 and the voltage waveform W1 in FIG. 3. This differential voltage is the voltage of the ringing component.

Figure 4A:
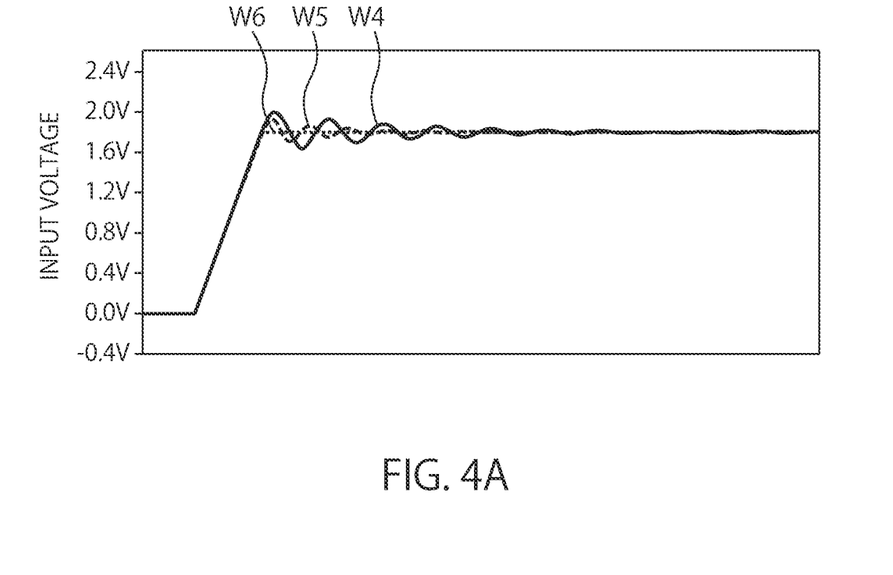
FIG. 4A illustrates a voltage waveform when different voltages are applied to a voltage input node.
Figure 4B:
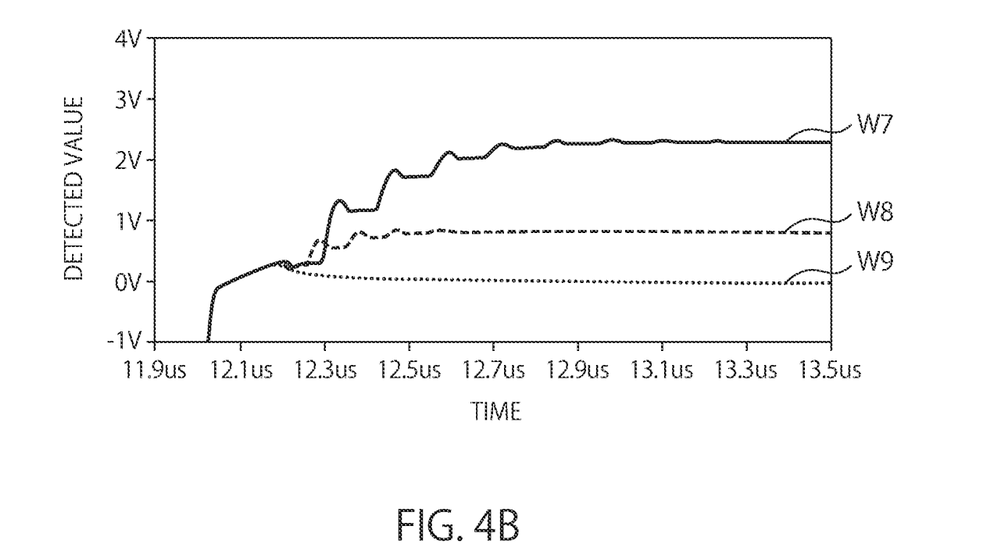
FIG. 4B illustrates an output voltage waveform of a subtractor corresponding to FIG. 4A.

FIG. 4A illustrates voltage waveforms W4 to W6 when voltages having different ringing components are applied to the voltage input node IN, and FIG. 4B illustrates corresponding output voltage waveforms W7 to W9 of the subtractor 4. As illustrated, the larger the ringing component, the higher the output voltage level of the subtractor 4.

Figure 5:
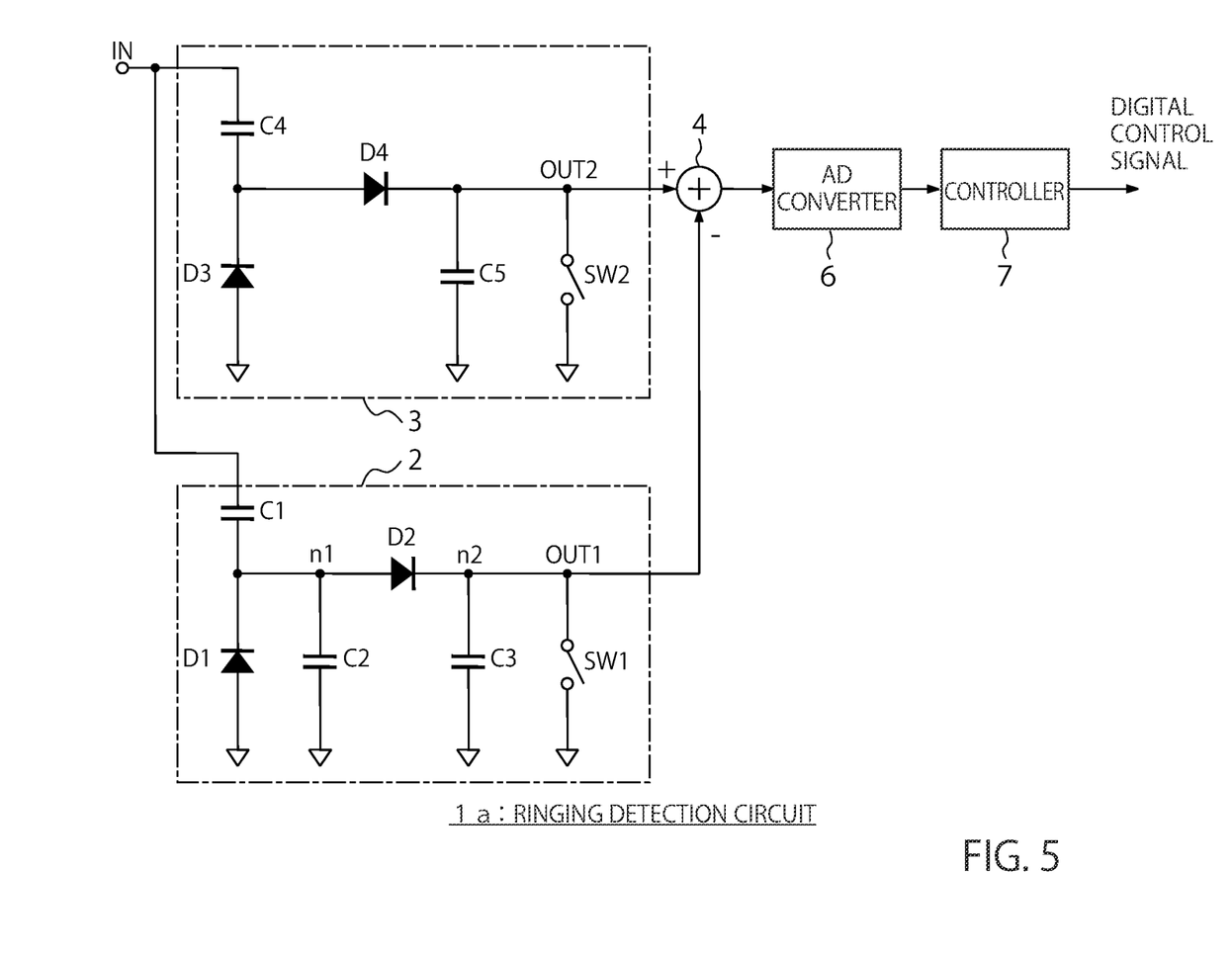
FIG. 5 is a block diagram of the ringing detection circuit in which an AD converter and a controller are added subsequent to the subtractor in FIG. 1.

FIG. 5 is a block diagram of a ringing detection circuit 1a in which an analog to digital (AD) converter 6 and a controller 7 are added subsequent to the subtractor 4 in FIG. 1. The AD converter 6 converts a voltage of a ringing component output from the subtractor 4 into a digital value. The controller 7 generates a digital control signal for controlling a control target based on the digital value. The digital control signal enables digital control of the control target.

Figure 6:
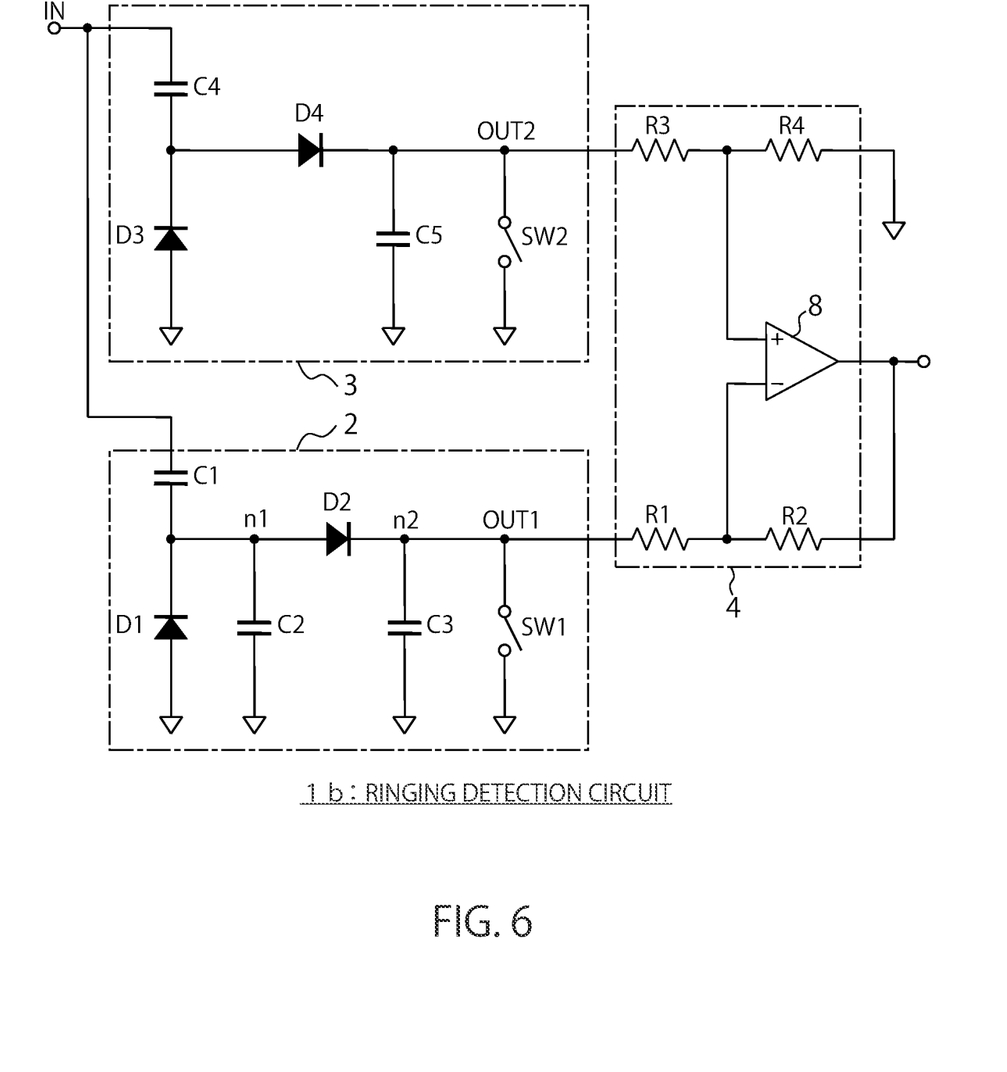
FIG. 6 is a block diagram of the ringing detection circuit including the subtractor with a specific internal configuration.

FIG. 6 is a block diagram of a ringing detection circuit 1b including the subtractor 4 with a specific internal configuration. The subtractor 4 in FIG. 6 includes an operational amplifier 8 and a plurality of resistors R1 to R4. An output voltage of the second peak-hold circuit 3 is input to the positive input node of the operational amplifier 8 via the resistor R3. The resistor R4 is connected between the positive input node of the operational amplifier 8 and the reference voltage node GND. An output voltage of the first peak-hold circuit 2 is input to the negative input node of the operational amplifier 8 via the resistor R1. The resistor R2 is connected between the negative input node of the operational amplifier 8 and the reference voltage node GND.

The operational amplifier 8 is a differential amplifier that outputs a voltage according to a difference voltage between a voltage at the positive input node and a voltage at the negative input node. The operational amplifier 8 makes it possible to extract the voltage of the ringing component easily.

As described above, each of the ringing detection circuits 1, 1a, and 1b according to the first embodiment outputs a surge voltage free of a ringing component from the first peak-hold circuit 2 and also outputs a surge voltage with the ringing component superimposed thereon from the second peak-hold circuit 3, and each ringing detection circuit outputs a difference voltage between these voltages from the subtractor 4 so as to accurately extract a voltage of the ringing component. The voltage of the ringing component output from the subtractor 4 is applicable to, for example, feedback control of a control voltage for controlling the power transducer.

Second Embodiment

A second embodiment relates to a power transducer including the ringing detection circuits 1, 1a, or 1b according to the first embodiment built-in. Hereinafter described is an example of a power transducer employing the ringing detection circuit 1. Note that the ringing detection circuit 1a in FIG. 5 or the ringing detection circuit 1b in FIG. 6 are also applicable.

Figure 7:
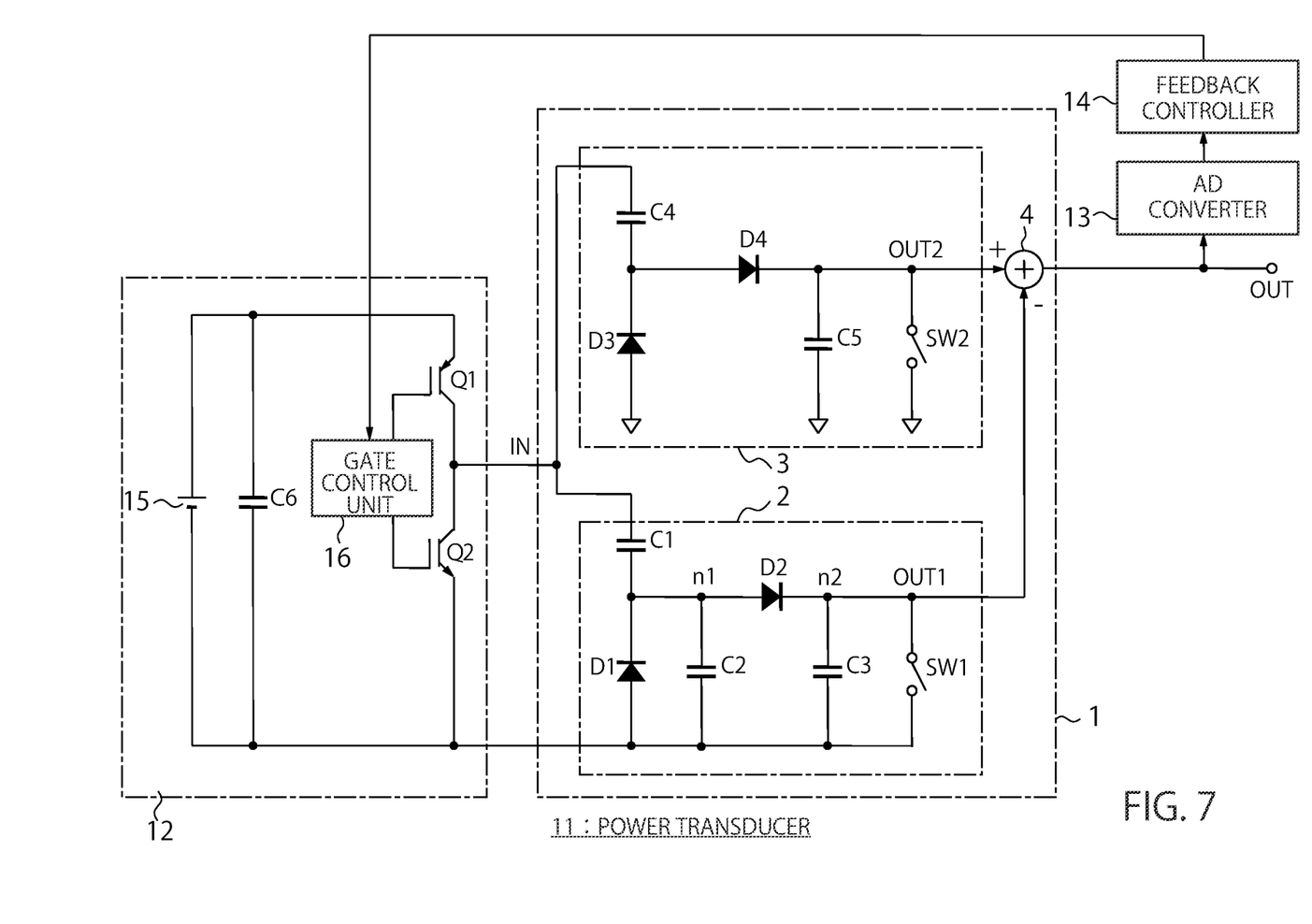
FIG. 7 is a circuit diagram of a power transducer according to a second embodiment.

FIG. 7 is a circuit diagram of a power transducer 11 according to the second embodiment. The power transducer 11 can be also called as an electronic apparatus. The power transducer 11 in FIG. 7 includes a power transduction circuit 12 that transduces power, the ringing detection circuit 1 according to the first embodiment, an AD converter 13, and a feedback controller 14.

The power transduction circuit 12 converts a DC voltage into an AC voltage. The power transduction circuit 12 includes a DC source 15, a capacitor C6, a high-side transistor Q1, a low-side transistor Q2, and a gate controller 16 that controls gate voltages of these transistors Q1 and Q2.

The power transduction circuit 12 converts a DC voltage into an AC voltage by alternately turning on and off the high-side transistor Q1 and the low-side transistor Q2. However, switching these transistors may cause a large surge voltage, which brings about ringing. Depending on the magnitude, the surge voltage and ringing may break a motor or the like that uses the AC voltage generated by the power transduction circuit 12 or may cause EMI noise. Therefore, the ringing detection circuit 1 in FIG. 7 detects a voltage of the ringing component superimposed on the surge voltage. The voltage of the ringing component detected by the ringing detection circuit 1 may be digitized and then sequentially stored in a memory (not illustrated) or the like to enable ex-post analysis of the ringing component.

The AD converter 13 converts the voltage of the ringing component detected by the ringing detection circuit 1 into a digital signal. Based on the digital signal converted by the AD converter 13, the feedback controller 14 generates a gate control signal for preventing ringing components. The gate control signal output from the feedback controller 14 is input to the gate controller 16. The gate controller 16 controls gate voltages at the high-side transistor Q1 and the low-side transistor Q2 based on the gate control signal so as to prevent ringing components.

FIG. 7 is an example of a device including the ringing detection circuit 1 according to the first embodiment. The ringing detection circuit 1 according to the first embodiment may be built in or connected to various devices which could cause ringing.

As described above, in the second embodiment, the ringing detection circuit 1 according to the first embodiment is built in or connected to various devices which could cause ringing. Accordingly, it is possible to accurately detect a ringing component superimposed on a surge voltage output from such devices. Therefore, it is possible to perform maintenance by checking whether the magnitude of the ringing component is within the normal range, and it is possible to perform feedback control of the devices according to the magnitude of the ringing component.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An electronic circuit comprising:
   a first peak-hold circuit to output a peak surge voltage free of a ringing component included in a voltage at a voltage input node;
   a second peak-hold circuit to output a peak surge voltage on which the ringing component included in the voltage at the voltage input node is superimposed; and
   a subtractor to subtract an output voltage of the first peak-hold circuit from an output voltage of the second peak-hold circuit to output a voltage of the ringing component,
   wherein the first peak-hold circuit includes:
      a first capacitor and a second capacitor connected in series between the voltage input node and a reference voltage node;
      a first rectifier element having an anode connected to the reference voltage node and a cathode connected to a connection node of the first capacitor and the second capacitor;
      a second rectifier element having an anode connected to the connection node of the first capacitor and the second capacitor; and
      a third capacitor connected between a cathode of the second rectifier element and the reference voltage node, and
      the cathode of the second rectifier element outputs the peak surge voltage free of the ringing component included in the voltage at the voltage input node.

2. The electronic circuit according to claim 1, further comprising:
   an analog to digital (AD) converter to convert the voltage of the ringing component output from the subtractor into a digital value; and
   a controller configured to generate a digital control signal for controlling a control target based on the digital value.

3. The electronic circuit according to claim 1, wherein the subtractor comprises a differential amplifier to output the voltage of the ringing component according to a difference between the output voltage of the first peak-hold circuit and the output voltage of the second peak-hold circuit.

4. The electronic circuit according to claim 1,
   wherein the second peak-hold circuit includes:
      a fourth capacitor having one end connected to the voltage input node;
      a third rectifier element having a cathode connected to the other end of the fourth capacitor and an anode connected to the reference voltage node;
      a fourth rectifier element having an anode connected to the cathode of the third rectifier element; and
      a fifth capacitor connected between a cathode of the fourth rectifier element and the reference voltage node, and the cathode of the fourth rectifier element outputs a peak surge voltage on which the ringing component included in the voltage at the voltage input node is superimposed.

5. The electronic circuit according to claim 4, wherein the first peak-hold circuit includes a first switch connected in parallel with the third capacitor,
the second peak-hold circuit includes a second switch connected in parallel with the fifth capacitor, and
when the voltage of the ringing component is output from the subtractor, the first switch and the second switch are temporarily turned on to discharge the third capacitor and the fifth capacitor.

6. The electronic circuit according to claim 4, wherein the second capacitor has a capacitance larger than a capacitance of the third capacitor.

7. The electronic circuit according to claim 6, wherein the first to third capacitors have capacitances set to satisfy Formula (1) where C1 is the capacitance of the first capacitor, C2 is the capacitance of the second capacitor, C3 is the capacitance of the third capacitor, and Vf is a forward voltage at the first and second rectifier elements, $$C_3 \le \frac{(C_2^2 + 2C_1C_2 + C_1^2)Vf}{C_1 V_{in} + (-C_2 - C_1)Vf} \quad (1)$$

8. The electronic circuit according to claim 4, wherein the second capacitor has a capacitance larger than a capacitance of the first capacitor.

9. An electronic apparatus comprising:
a power transduction circuit to transduce power; and
a ringing detection circuit to output a voltage of a ringing component included in an output voltage of the power transduction circuit,
wherein the ringing detection circuit includes:
a first peak-hold circuit to output a peak surge voltage free of a ringing component included in a voltage at a voltage input node;
a second peak-hold circuit to output a peak surge voltage on which the ringing component included in the voltage at the voltage input node is superimposed; and
a subtractor to subtract an output voltage of the first peak-hold circuit from an output voltage of the second peak-hold circuit to output a voltage of the ringing component,
wherein the first peak-hold circuit includes:
a first capacitor and a second capacitor connected in series between the voltage input node and a reference voltage node;
a first rectifier element having an anode connected to the reference voltage node and a cathode connected to a connection node of the first capacitor and the second capacitor;
a second rectifier element having an anode connected to the connection node of the first capacitor and the second capacitor; and
a third capacitor connected between a cathode of the second rectifier element and the reference voltage node, and
the cathode of the second rectifier element outputs the peak surge voltage free of the ringing component included in the voltage at the voltage input node.

10. The electronic apparatus according to claim 9, further comprising
a feedback control circuit configured to perform feedback control on the power transduction circuit based on the voltage of the ringing component.

11. The electronic apparatus according to claim 9, further comprising:
an analog to digital (AD) converter to convert the voltage of the ringing component output from the subtractor into a digital value; and
a controller configured to generate a digital control signal for controlling a control target based on the digital value.

12. The electronic apparatus according to claim 9, wherein the subtractor comprises a differential amplifier to output the voltage of the ringing component according to a difference between the output voltage of the first peak-hold circuit and the output voltage of the second peak-hold circuit.

13. The electronic apparatus according to claim 9, wherein the second peak-hold circuit includes:
a fourth capacitor having one end connected to the voltage input node;
a third rectifier element having a cathode connected to the other end of the fourth capacitor and an anode connected to the reference voltage node;
a fourth rectifier element having an anode connected to the cathode of the third rectifier element; and
a fifth capacitor connected between a cathode of the fourth rectifier element and the reference voltage node, and
the cathode of the fourth rectifier element outputs a peak surge voltage on which the ringing component included in the voltage at the voltage input node is superimposed.

14. The electronic apparatus according to claim 13, wherein the first peak-hold circuit includes a first switch connected in parallel with the third capacitor,
the second peak-hold circuit includes a second switch connected in parallel with the fifth capacitor, and
when the voltage of the ringing component is output from the subtractor, the first switch and the second switch are temporarily turned on to discharge the third capacitor and the fifth capacitor.

15. The electronic apparatus according to claim 13, wherein the second capacitor has a capacitance larger than a capacitance of the third capacitor.

16. The electronic apparatus according to claim 15, wherein the first to third capacitors have capacitances set to satisfy Formula (1) where C1 is the capacitance of the first capacitor, C2 is the capacitance of the second capacitor, C3 is the capacitance of the third capacitor, and Vf is a forward voltage at the first and second rectifier elements, $$C_3 \le \frac{(C_2^2 + 2C_1C_2 + C_1^2)Vf}{C_1 V_{in} + (-C_2 - C_1)Vf} \quad (1)$$

17. The electronic apparatus according to claim 13, wherein the second capacitor has a capacitance larger than a capacitance of the first capacitor.

18. An electronic circuit comprising:
a first peak-hold circuit to output a peak surge voltage free of a ringing component included in a voltage at a voltage input node;

a second peak-hold circuit to output a peak surge voltage on which the ringing component included in the voltage at the voltage input node is superimposed;
a subtractor to subtract an output voltage of the first peak-hold circuit from an output voltage of the second peak-hold circuit to output a voltage of the ringing component;
an analog to digital (AD) converter to convert the voltage of the ringing component output from the subtractor into a digital value; and
a controller configured to generate a digital control signal for controlling a control target based on the digital value.

19. An electronic apparatus comprising:
a power transduction circuit to transduce power; and
a ringing detection circuit to output a voltage of a ringing component included in an output voltage of the power transduction circuit,
wherein the ringing detection circuit includes:
a first peak-hold circuit to output a peak surge voltage free of a ringing component included in a voltage at a voltage input node;
a second peak-hold circuit to output a peak surge voltage on which the ringing component included in the voltage at the voltage input node is superimposed;
a subtractor to subtract an output voltage of the first peak-hold circuit from an output voltage of the second peak-hold circuit to output a voltage of the ringing component;
an analog to digital (AD) converter to convert the voltage of the ringing component output from the subtractor into a digital value; and
a controller configured to generate a digital control signal for controlling a control target based on the digital value.

* * * * *